(12) United States Patent
Hirayama et al.

(10) Patent No.: US 7,034,442 B2
(45) Date of Patent: Apr. 25, 2006

(54) ELECTRO-OPTICAL DEVICE, METHOD OF MANUFACTURING THE SAME, AND ELECTRONIC INSTRUMENT

(75) Inventors: Hiroshi Hirayama, Shiojiri (JP); Hayato Nakanishi, Toyama (JP)

(73) Assignee: Seiko Epson Corporation, Tokyo (JP)

( * ) Notice: Subject to any disclaimer, the term of this patent is extended or adjusted under 35 U.S.C. 154(b) by 128 days.

(21) Appl. No.: 10/777,380

(22) Filed: Feb. 13, 2004

(65) Prior Publication Data

US 2004/0183431 A1   Sep. 23, 2004

(30) Foreign Application Priority Data

Feb. 20, 2003 (JP) ............................. 2003-042318
Dec. 24, 2003 (JP) ............................. 2003-427364

(51) Int. Cl.
*H01J 5/50* (2006.01)
*H01J 5/48* (2006.01)
*H05K 1/03* (2006.01)
*H01R 12/04* (2006.01)
*H01R 1/11* (2006.01)

(52) U.S. Cl. .................... 313/51; 313/498; 174/255; 174/261

(58) Field of Classification Search ................ 313/498, 313/51; 174/255, 261
See application file for complete search history.

(56) References Cited

U.S. PATENT DOCUMENTS

| | | | | |
|---|---|---|---|---|
| 5,430,616 A | * | 7/1995 | Katsu et al. ............... | 361/809 |
| 6,519,021 B1 | * | 2/2003 | Aruga ........................ | 349/152 |
| 6,590,629 B1 | * | 7/2003 | Hirobe et al. ............... | 349/149 |
| 6,690,110 B1 | * | 2/2004 | Yamada et al. ............. | 313/506 |
| 6,774,973 B1 | * | 8/2004 | Ko .............................. | 349/153 |
| 2002/0125820 A1 | * | 9/2002 | Sheu et al. .................. | 313/505 |
| 2003/0168996 A1 | | 9/2003 | Brevetti et al. | |
| 2003/0189686 A1 | * | 10/2003 | Hirosue et al. ............. | 349/149 |
| 2004/0108977 A1 | * | 6/2004 | Hirayama .................... | 345/76 |
| 2004/0135145 A1 | * | 7/2004 | Nakanishi .................... | 257/59 |
| 2005/0024305 A1 | | 2/2005 | Byoung-Choo | |
| 2005/0140782 A1 | * | 6/2005 | Nakanishi .................... | 348/92 |
| 2005/0195355 A1 | * | 9/2005 | Kwak et al. ................ | 349/149 |

FOREIGN PATENT DOCUMENTS

| | | |
|---|---|---|
| JP | A 11-24606 | 1/1999 |
| JP | A 2001-109395 | 4/2001 |
| JP | A 2002-151276 | 5/2002 |
| JP | A 2003-66868 | 3/2003 |
| JP | A 2003-229250 | 8/2003 |

(Continued)

OTHER PUBLICATIONS

U.S. Appl. No. 10/460,388, filed Jun. 13, 2003, Hirayama.

*Primary Examiner*—Joseph Williams
*Assistant Examiner*—Peter Macchiarolo
(74) *Attorney, Agent, or Firm*—Oliff & Berridge, PLC

(57) ABSTRACT

An electro-optical device has electro-optical elements provided in a pixel region of a substrate, pixel electrodes, a common electrode, interconnects electrically connected with the pixel electrodes, a conductive section electrically connected with the common electrode, a common interconnect electrically connected with the interconnects, a number of the common interconnect being less than a number of the interconnects, and a side interconnect which is provided in an end region separated from a region in which the pixel region is provided by a straight line passing outside the pixel region and is electrically connected with the conductive section.

6 Claims, 10 Drawing Sheets

FOREIGN PATENT DOCUMENTS

| | | |
|---|---|---|
| JP | A 2003-295793 | 10/2003 |
| JP | A 2003-323129 | 11/2003 |
| KR | 2002-0027435 | 4/2002 |
| WO | WO 2003/060858 A1 | 7/2003 |

* cited by examiner

ELECTRO-OPTICAL DEVICE, METHOD OF MANUFACTURING THE SAME, AND ELECTRONIC INSTRUMENT

Japanese Patent Application No. 2003-42318, filed on Feb. 20, 2003 and Japanese Patent Application No. 2003-427364, filed on Dec. 24, 2003, are hereby incorporated by reference in their entirety.

BACKGROUND OF THE INVENTION

The present invention relates to an electro-optical device, a method of manufacturing the same, and an electronic instrument.

In a device including a large number of interconnects such as an electroluminescent panel, if all the interconnects are formed on one substrate, the interconnect region (region in the periphery of the substrate called a "frame", for example) is increased. This results in an increase in the size of the substrate. Therefore, a reduction of the interconnect region (frame, for example) has been demanded.

BRIEF SUMMARY OF THE INVENTION

An electro-optical device according to a first aspect of the present invention has a substrate, a plurality of pixel electrodes provided in a pixel region of the substrate, a plurality of electro-optical elements, each of the electro-optical elements being provided for one of the pixel electrodes, and a common electrode provided in common for the electro-optical elements, each of the electro-optical elements being driven by a voltage applied to corresponding one of the pixel electrodes and a voltage applied to the common electrode, the electro-optical device including:

a plurality of interconnects electrically connected with the pixel electrodes;

a conductive section electrically connected with the common electrode;

at least one common interconnect electrically connected with the interconnects, a number of the common interconnect being less than a number of the interconnects; and a side interconnect which is provided in an end region separated from a region in which the pixel region is provided by a straight line passing outside the pixel region and is electrically connected with the conductive section.

An electro-optical device according to a second aspect of the present invention has a substrate, a plurality of pixel electrodes provided in a pixel region of the substrate, a plurality of electro-optical elements, each of the electro-optical elements being provided for one of the pixel electrodes, and a common electrode provided in common for the electro-optical elements, each of the electro-optical elements being driven by a voltage applied to corresponding one of the pixel electrodes and a voltage applied to the common electrode, the electro-optical device including:

a plurality of interconnects electrically connected with the pixel electrodes;

a conductive section electrically connected with the common electrode;

at least one common interconnect electrically connected with the interconnects through first contact sections, a number of the common interconnect being less than a number of the interconnects; and a side interconnect electrically connected with the conductive section through a second contact section, wherein the second contact section is provided in an end region separated from a region in which the pixel region is provided by a straight line passing outside the pixel region.

An electro-optical device according to a third aspect of the present invention has a substrate, a plurality of pixel electrodes provided in a pixel region of the substrate, a plurality of electro-optical elements, each of the electro-optical elements being provided for one of the pixel electrodes, and a common electrode provided in common for the electro-optical elements, each of the electro-optical elements being driven by a voltage applied to corresponding one of the pixel electrodes and a voltage applied to the common electrode, the electro-optical device including:

a plurality of interconnects electrically connected with the pixel electrodes;

a conductive section electrically connected with the common electrode;

a plurality of external terminals provided in an end region separated from a region in which the pixel region is provided by a straight line passing outside the pixel region; and a side interconnect which is formed in the end region in which the external terminals are provided and includes a first section and a second section, the first section extending from one of the external terminals in a direction toward the pixel region, and the second section being bent at the first section and extends in a width direction of the pixel region and electrically connected with the conductive section:

An electro-optical device according to a fourth aspect of the present invention has a substrate, a plurality of pixel electrodes provided in a pixel region of the substrate, a plurality of electro-optical elements, each of the electro-optical elements being provided for one of the pixel electrodes, and a common electrode provided in common for the electro-optical elements, each of the electro-optical elements being driven by a voltage applied to corresponding one of the pixel electrodes and a voltage applied to the common electrode, the electro-optical device including:

a plurality of interconnects electrically connected with the pixel electrodes;

a conductive section electrically connected with the common electrode;

a plurality of external terminals; and a side interconnect which includes a first section and a second section, the first section extending from one of the external terminals in a direction toward the pixel region, and the second section being bent at the first section and extends in a width direction of the pixel region and electrically connected with the conductive section, wherein a contact section between the conductive section and the side interconnect is provided in an end region separated from a region in which the pixel region is provided by a straight line passing outside the pixel region.

An electronic instrument according to a fifth aspect of the present invention has any one of the above electro-optical devices.

A method of manufacturing an electro-optical device according to a sixth aspect of the present invention includes:

forming a plurality of electro-optical elements in a pixel region of a substrate;

forming a plurality of pixel electrodes on the substrate for supplying electrical energy to the electro-optical elements;

forming a common electrode on the substrate for supplying electrical energy to the electro-optical elements;

forming a plurality of interconnects on the substrate so as to be electrically connected with the pixel electrodes;

forming a conductive section on the substrate so as to be electrically connected with the common electrode;

forming at least one common interconnect on the substrate so as to be electrically connected with the interconnects, a number of the at least one common interconnect being less than a number of the interconnects; and forming a side interconnect in an end region of the substrate separated from a region in which the pixel region is provided by a straight line passing outside the pixel region so as to be electrically connected with the conductive section.

A method of manufacturing an electro-optical device according to a seventh aspect of the present invention includes:

forming a plurality of electro-optical elements in a pixel region of a substrate;

forming a plurality of pixel electrodes on the substrate for supplying electrical energy to the electro-optical elements;

forming a common electrode on the substrate for supplying electrical energy to the electro-optical elements;

forming a plurality of interconnects on the substrate so as to be electrically connected with the pixel electrodes;

forming a conductive section on the substrate so as to be electrically connected with the common electrode;

forming at least one common interconnect on the substrate so as to be electrically connected with the interconnects through first contact sections, a number of the common interconnect being less than a number of the interconnects; and forming a side interconnect on the substrate so as to be electrically connected with the conductive section through a second contact section, wherein the second contact section is provided in an end region separated from a region in which the pixel region is provided by a straight line passing outside the pixel region.

A method of manufacturing an electro-optical device according to an eighth aspect of the present invention includes:

forming a plurality of electro-optical elements in a pixel region of a substrate;

forming a plurality of pixel electrodes on the substrate for supplying electrical energy to the electro-optical elements;

forming a common electrode on the substrate for supplying electrical energy to the electro-optical elements;

forming a plurality of interconnects on the substrate so as to be electrically connected with the pixel electrodes;

forming a conductive section on the substrate so as to be electrically connected with the common electrode;

forming a plurality of external terminals in an end region of the substrate separated from a region in which the pixel region is provided by a straight line passing outside the pixel region; and forming a side interconnect in the end region of the substrate in which the external terminals are provided and includes a first section and a second section, the first section extending from one of the external terminals in a direction toward the pixel region, and the second section being bent at the first section and extends in a width direction of the pixel region and electrically connected with the conductive section.

A method of manufacturing an electro-optical device according to a ninth aspect of the present invention includes:

forming a plurality of electro-optical elements in a pixel region of a substrate;

forming a plurality of pixel electrodes on the substrate for supplying electrical energy to the electro-optical elements;

forming a common electrode on the substrate for supplying electrical energy to the electro-optical elements;

forming a plurality of interconnects on the substrate so as to be electrically connected with the pixel electrodes;

forming a conductive section on the substrate so as to be electrically connected with the common electrode;

forming a plurality of external terminals on the substrate; and forming on the substrate a side interconnect which includes a first section and a second section, the first section extending from one of the external terminals in a direction toward the pixel region, and the second section being bent at the first section and extends in a width direction of the pixel region and electrically connected with the conductive section, wherein a contact section between the conductive section and the side interconnect is provided in an end region separated from a region in which the pixel region is provided by a straight line passing outside the pixel region.

DETAILED DESCRIPTION OF THE EMBODIMENT

Figure 1:
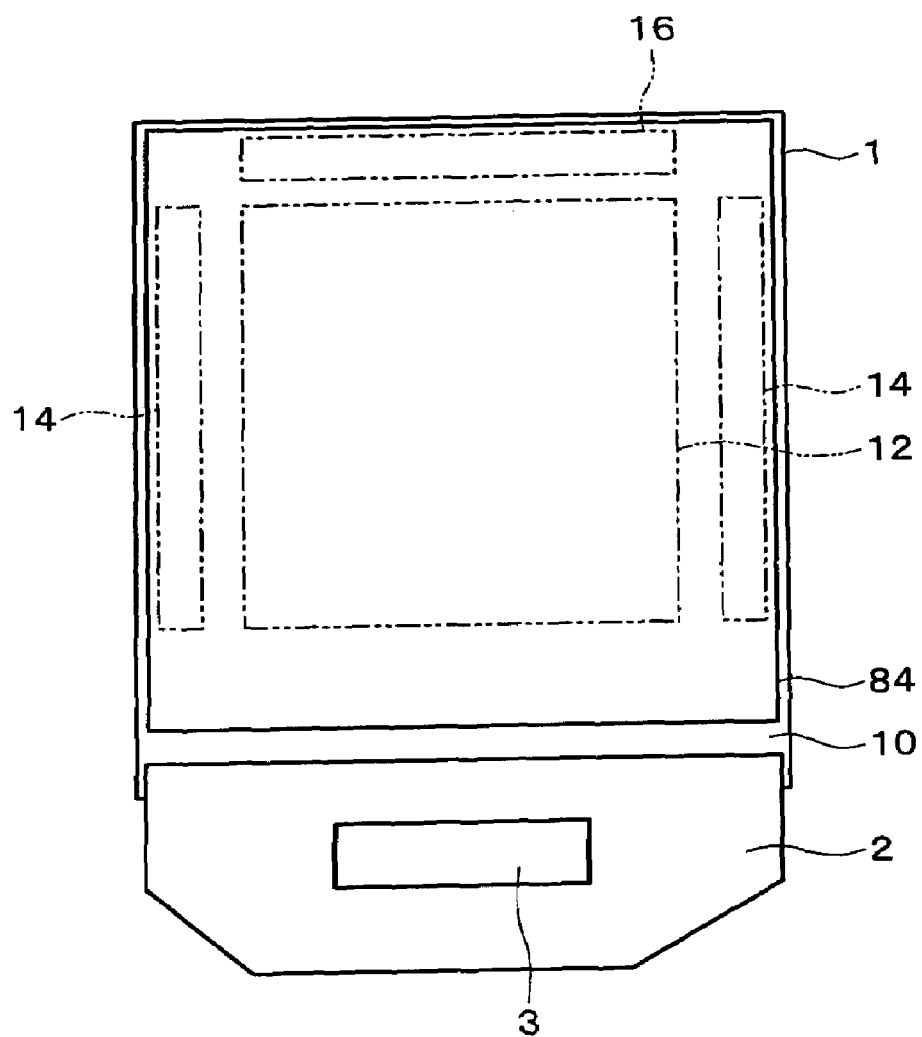
FIG. 1 is illustrative of an electro-optical device according to a first embodiment of the present invention.

An embodiment of the present invention may reduce the interconnect region (frame, for example).

(1) An electro-optical device according to a first embodiment of the present invention has a substrate, a plurality of pixel electrodes provided in a pixel region of the substrate, a plurality of electro-optical elements, each of the electro optical elements being provided for one of the pixel electrodes, and a common electrode provided in common for the electro-optical elements, each of the electro-optical elements being driven by a voltage applied to corresponding one of the pixel electrodes and a voltage applied to the common electrode, the electro-optical device including:

a plurality of interconnects electrically connected with the pixel electrodes;

a conductive section electrically connected with the common electrode;

at least one common interconnect electrically connected with the interconnects, a number of the common interconnect being less than a number of the interconnects; and a side interconnect which is provided in an end region separated from a region in which the pixel region is provided by a straight line passing outside the pixel region and is electrically connected with the conductive section.

According to this electro-optical device, since the side interconnect is formed in the end region, the interconnect region (frame, for example) can be reduced in the other regions. In this electro-optical device, the substrate is not limited to a substrate in the shape of a plate. The substrate includes a substrate of another shape capable of supporting other members. In this electro-optical device, the "electrical connection" includes not only a direct connection, but also a connection through another device (transistor, diode, or the like).

(2) With this electro-optical device, the at least one common interconnect may be formed in the end region. According to this electro-optical device, since the common interconnect and the side interconnect are formed in the end region, the interconnect region (frame, for example) can be reduced in the other regions.

(3) An electro-optical device according to a second embodiment of the present invention has a substrate, a plurality of pixel electrodes provided in a pixel region of the substrate, a plurality of electro-optical elements, each of the electro-optical elements being provided for one of the pixel electrodes, and a common electrode provided in common for the electro-optical elements, each of the electro-optical elements being driven by a voltage applied to corresponding one of the pixel electrodes and a voltage applied to the common electrode, the electro-optical device including:

a plurality of interconnects electrically connected with the pixel electrodes;

a conductive section electrically connected with the common electrode;

at least one common interconnect electrically connected with the interconnects through first contact sections, a number of the common interconnect being less than a number of the interconnects; and a side interconnect electrically connected with the conductive section through a second contact section, wherein the second contact section is provided in an end region separated from a region in which the pixel region is provided by a straight line passing outside the pixel region.

According to this electro-optical device, since the second contact section between the conductive section and the side interconnect is formed in the end region, the interconnect region (frame, for example) can be reduced in the other regions. In this electro-optical device, the substrate is not limited to a substrate in the shape of a plate. The substrate includes a substrate of another shape capable of supporting other members. In this electro-optical device, the "electrical connection" includes not only a direct connection, but also a connection through another device (transistor, diode, or the like).

(4) With this electro-optical device, the first contact sections may be formed in the end region. According to this electro-optical device, since the first contact section between the interconnects and the common interconnect and the second contact section between the conductive section and the side interconnect are formed in the end region, the interconnect region (frame; for example) can be reduced in the other regions.

(5) This electro-optical device may further include a plurality of external terminals.

(6). An electro-optical device according to a third embodiment of the present invention has a substrate, a plurality of pixel electrodes provided in a pixel region of the substrate, a plurality of electro-optical elements, each of the electro-optical elements being provided for one of the pixel electrodes, and a common electrode provided in common for the electro-optical elements, each of the electro-optical elements being driven by a voltage applied to corresponding one of the pixel electrodes and a voltage applied to the common electrode, the electro-optical device including:

a plurality of interconnects electrically connected with the pixel electrodes;

a conductive section electrically connected with the common electrode;

a plurality of external terminals provided in an end region separated from a region in which the pixel region is provided by a straight line passing outside the pixel region; and a side interconnect which is formed in the end region in which the external terminals are provided and includes a first section and a second section, the first section extending from one of the external terminals in a direction toward the pixel region, and the second section being bent at the first section and extends in a width direction of the pixel region and electrically connected with the conductive section.

According to this electro-optical device, since the side interconnect is formed in the end region, the interconnect region (frame, for example) can be reduced in the other regions. In this electro-optical device, the substrate is not limited to a substrate in the shape of a plate. The substrate includes a substrate of another shape capable of supporting other members. In this electro-optical device, the "electrical connection" includes not only a direct connection, but also a connection through another device (transistor, diode, or the like).

(7) An electro-optical device according to a fourth embodiment of the present invention has a substrate, a plurality of pixel electrodes provided in a pixel region of the substrate, a plurality of electro-optical elements, each of the electro-optical elements being provided for one of the pixel electrodes, and a common electrode provided in common for the electro-optical elements, each of the electro-optical elements, being driven by a voltage applied to corresponding one of the pixel electrodes and a voltage applied to the common electrode, the electro-optical device including:

a plurality of interconnects electrically connected with the pixel electrodes;

a conductive section electrically connected with the common electrode;

a plurality of external terminals; and a side interconnect which includes a first section and a second section, the first section extending from one of the external terminals in a direction toward the pixel region, and the second section being bent at the first section and extends in a width direction of the pixel region and electrically connected with the conductive section, wherein a contact section between the conductive section and the side interconnect is provided in an end region separated from a region in which the pixel region is provided by a straight line passing outside the pixel region.

According to this electro-optical device, since the contact section between the conductive section and the side interconnect is formed in the end region, the interconnect region (frame, for example) can be reduced in the other regions. In this electro-optical device, the substrate is not limited to a substrate in the shape of a plate. The substrate includes a substrate of another shape capable of supporting other members. In this electro-optical device, the "electrical connection" includes not only a direct connection, but also a connection through another device (transistor, diode, or the like).

(8) An electronic instrument according to a fifth embodiment of the present invention has any one of the above electro-optical devices.

(9) A method of manufacturing an electro-optical device according to a sixth embodiment of the present invention includes:

forming a plurality of electro-optical elements in a pixel region of a substrate;

forming a plurality of pixel electrodes on the substrate for supplying electrical energy to the electro-optical elements;

forming a common electrode on the substrate for supplying electrical energy to the electro-optical elements;

forming a plurality of interconnects on the substrate so as to be electrically connected with the pixel electrodes;

forming a conductive section on the substrate so as to be electrically connected with the common electrode;

forming at least one common interconnect on the substrate so as to be electrically connected with the interconnects, a number of the at least one common interconnect being less than a number of the interconnects; and forming a side interconnect in an end region of the substrate separated from a region in which the pixel region is provided by a straight line passing outside the pixel region so as to be electrically connected with the conductive section.

According to this electro-optical device, since the side interconnect is formed in the end region, the interconnect region (frame, for example) can be reduced in the other regions. In this electro-optical device, the substrate is not limited to a substrate in the shape of a plate. The substrate includes a substrate of another shape capable of supporting other members. In this electro-optical device, the "electrical connection" includes not only a direct connection, but also a connection through another device (transistor, diode, or the like).

(10) This method of manufacturing an electro-optical device may further include forming the at least one common interconnect in the end region. According to this electro-optical device, since the common interconnect and the side interconnect are formed in the end region, the interconnect region (frame, for example) can be reduced in the other regions.

(11) A method of manufacturing an electro-optical device according to a seventh embodiment of the present invention includes:

forming a plurality of electro-optical elements in a pixel region of a substrate;

forming a plurality of pixel electrodes on the substrate for supplying electrical energy to the electro-optical elements;

forming a common electrode on the substrate for supplying electrical energy to the electro-optical elements;

forming a plurality of interconnects on the substrate so as to be electrically connected with the pixel electrodes;

forming a conductive section on the substrate so as to be electrically connected with the common electrode;

forming at least one common interconnect on the substrate so as to be electrically connected with the interconnects through first contact sections, a number of the common interconnect being less than a number of the interconnects; and forming a side interconnect on the substrate so as to be electrically connected with the conductive section through a second contact section, wherein the second contact section is provided in an end region separated from a region in which the pixel region is provided by a straight line passing outside the pixel region.

According to this electro-optical device, since the second contact section between the conductive section and the side interconnect is formed in the end region, the interconnect region (frame, for example) can be reduced in the other regions. In this electro-optical device, the substrate is not limited to a substrate in the shape of a plate. The substrate includes a substrate of another shape capable of supporting other members. In this electro-optical device, the "electrical connection" includes not only a direct connection, but also a connection through another device (transistor, diode, or the like).

(12) This method of manufacturing an electro-optical device may further includes forming the at least one common interconnect in the end region. According to this electro-optical device, since the first contact section between the interconnects and the common interconnect and the second contact section between the conductive section and the side interconnect are formed in the end region, the interconnect region (frame, for example) can be reduced in the other regions.

(13) A method of manufacturing an electro-optical device according to an eight embodiment of the present invention may include:

forming a plurality of electro-optical elements in a pixel region of a substrate;

forming a plurality of pixel electrodes on the substrate for supplying electrical energy to the electro-optical elements;

forming a common electrode on the substrate for supplying electrical energy to the electro-optical elements;

forming a plurality of interconnects on the substrate so as to be electrically connected with the pixel electrodes;

forming a conductive section on the substrate so as to be electrically connected with the common electrode;

forming a plurality of external terminals in an end region of the substrate separated from a region in which the pixel region is provided by a straight line passing outside the pixel region; and forming a side interconnect in the end region of the substrate in which the external terminals are provided and includes a first section and a second section, the first section extending from one of the external terminals in a direction toward the pixel region, and the second section being bent at the first section and extends in a width direction of the pixel region and electrically connected with the conductive section.

According to this electro-optical device, since the side interconnect is formed in the end region, the interconnect region (frame, for example) can be reduced in the other regions. In this electro-optical device, the substrate is not limited to a substrate in the shape of a plate. The substrate includes a substrate of another shape capable of supporting other members. In this electro-optical device, the "electrical connection" includes not only a direct connection, but also a connection through another device (transistor, diode, or the like).

(14) A method of manufacturing an electro-optical device according to a ninth embodiment of the present invention includes:

forming a plurality of electro-optical elements in a pixel region of a substrate;

forming a plurality of pixel electrodes on the substrate for supplying electrical energy to the electro-optical elements;

forming a common electrode on the substrate for supplying electrical energy to the electro-optical elements;

forming a plurality of interconnects on the substrate so as to be electrically connected with the pixel electrodes;

forming a conductive section on the substrate so as to be electrically connected with the common electrode;

forming a plurality of external terminals on the substrate; and forming on the substrate a side interconnect which includes a first section and a second section, the first section extending from one of the external terminals in a direction toward the pixel region, and the second section being bent at the first section and extends in a width direction of the pixel region and electrically connected with the conductive section, wherein a contact section between the conductive section and the side interconnect is provided in an end region separated from a region in which the pixel region is provided by a straight line passing outside the pixel region.

According to this electro-optical device, since the contact section between the conductive section and the side interconnect is formed in the end region, the interconnect region (frame, for example) can be reduced in the other regions. In this electro-optical device, the substrate is not limited to a substrate in the shape of a plate. The substrate includes a substrate of another shape capable of supporting other members. In this electro-optical device, the "electrical connection" includes not only a direct connection, but also a connection through another device (transistor, diode, or the like).

The embodiment of the present invention is described below with reference to the drawings.

First Embodiment

Figure 2:
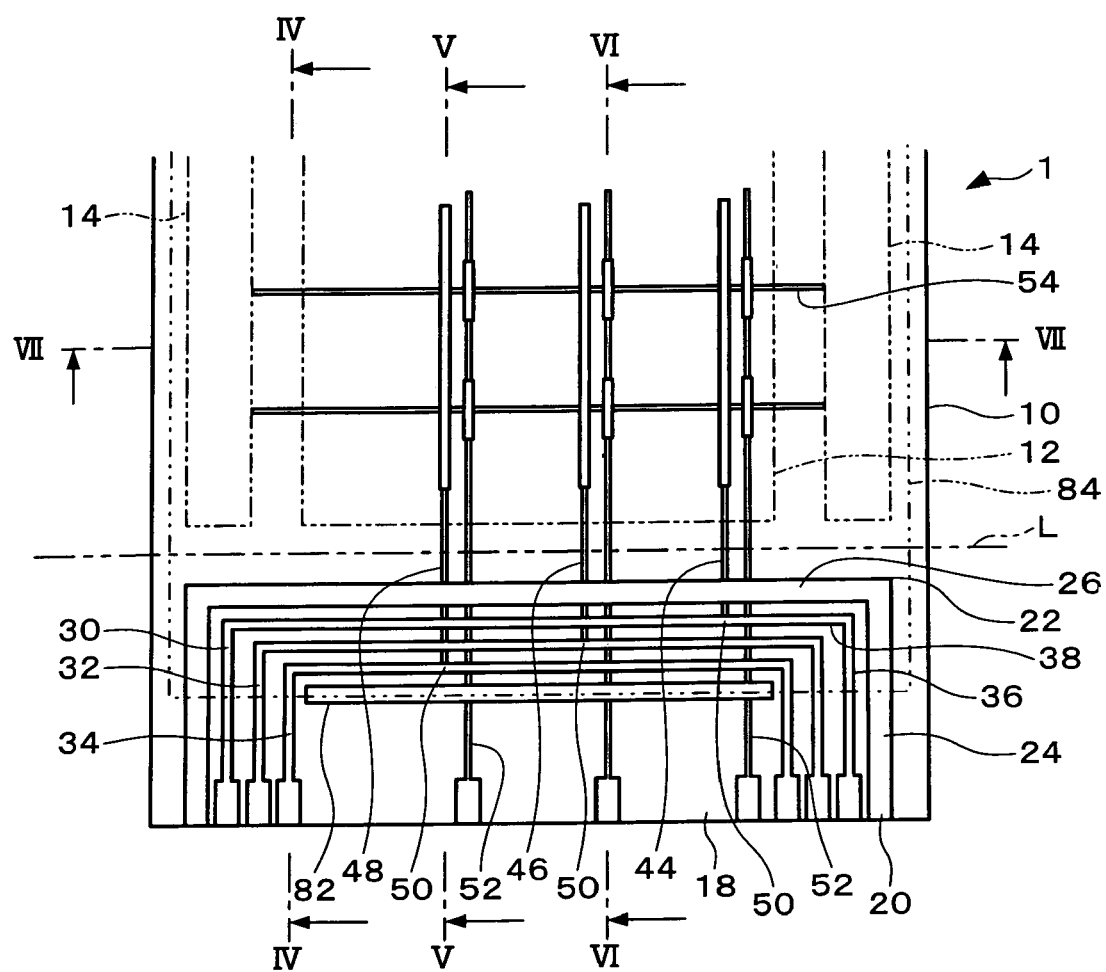
FIG. 2 is illustrative of details of the electro-optical device according to the first embodiment of the present invention.

FIG. 1 is illustrative of an electro-optical device according to a first embodiment of the present invention. FIG. 2 shows details of the electro-optical device. An electro-optical device 1 shown in FIG. 1 is an organic electroluminescent (EL) device (organic EL panel, for example). A substrate 2 (flexible substrate, for example) is attached and electrically connected to the electro-optical device 1. The substrate 2 may be attached and electrically connected with the electro-optical device 1 using an anisotropic conductive material such as an anisotropic conductive film or anisotropic conductive paste. The electrical connection includes contact. This also applies to the following description. The substrate 2 is an interconnect substrate on which an interconnect pattern and a terminal (not shown) are formed. An integrated circuit chip 3 (or semiconductor chip) is mounted on the substrate 2. The integrated circuit chip 3 may include a power supply circuit, a control circuit, and the like. The integrated circuit chip 3 may be mounted by tape automated bonding (TAB) or applying chip-on-film (COF). The package form may be that of a tape carrier package (TCP). The electro-optical device 1 including the substrate 2 on which the integrated circuit chip 3 is mounted may be referred to as an electronic module (display module such as a liquid crystal module or an EL module, for example).

The electro-optical device 1 includes a substrate 10. The substrate 10 may be a rigid substrate (glass substrate or silicon substrate, for example) or a flexible substrate (film substrate, for example). The substrate 10 may have light transmitting properties or light shielding properties. In a bottom-emission (or back-emission) type display device (organic EL panel, for example), the substrate 10 having light transmitting properties may be used, and light may be emitted from the side of the substrate 10. In a top-emission type organic EL panel, the substrate 10 having light shielding properties may be used. The substrate 10 is not limited to a substrate in the shape of a plate. The substrate 10 includes a substrate of another shape capable of supporting other members.

The substrate 10 includes a pixel region 12 (display region, for example). At least one driver circuit 14 (scanning line driver circuit, for example) may be formed on the substrate 10. The driver circuit 14 drives the operation (display operation, for example) in the pixel region 12. A pair of driver circuits 14 may be disposed on both sides of the pixel region 12, respectively. An auxiliary circuit 16 may be formed on the substrate 10. The auxiliary circuit 16 may be an inspection circuit for inspecting whether or not the operation (display operation, for example) in the pixel region 12 is normally performed, or a precharge circuit for increasing the operation speed (display speed) in the pixel region 12. At least either the driver circuit 14 or the auxiliary circuit 16 may be formed on the substrate 10 using a polysilicon film or the like, or may be an integrated circuit chip mounted on the substrate 10. The integrated circuit chip 3 outside the substrate 10 may control the operation in the pixel region 12.

A plurality of external terminals 20 may be formed on the substrate 10. The external terminals 20 may be formed along one side of the substrate 10. The external terminals 20 are formed in an end region 18. The end region 18 is a region separated from a region for the pixel region 12 by a straight line L which passes outside the pixel region 12 (see FIG. 2). The end region 18 is a part of the peripheral region of the substrate 10. The definition for the end region is the same in the following description. The pixel region 12 may be the center region of the substrate 10 (region excluding the peripheral region).

At least one side interconnect 22 (cathode line, for example) may be formed on the substrate 10. The side interconnect 22 may be formed in the end region 18 (end region in which the external terminals 20 are formed, for example). The side interconnect 22 may be electrically connected with at least two external terminals 20. The side interconnect 22 may include a first section 24 which extends from the external terminal 20 in the direction toward the pixel region 12. The side interconnect 22 may include a second section 26 which is bent at the first section 24 and extends in the direction of the width of the pixel region 12. The second section 26 may be electrically connected with a conductive section 74 (see FIG. 4).

One or a plurality of common interconnects 30, 32, and 34 (common anode lines, for example) may be formed on the substrate 10. The common interconnects 30, 32, and 34 may be formed in the end region 18 (end region in which the side interconnect 22 is formed or the end region in which the external terminals 20 are formed, for example). At least one of the common interconnects 30, 32, and 34 may be electrically connected with at least two of the external terminals 20. At least one of the common interconnects 30, 32, and 34 may include a first section 36 which extends from the external terminal 20 in the direction toward the pixel region 12. At least one of the common interconnects 30, 32, and 34 may include a second section 38 which is bent at the first section 36 and extends in the direction of the width of the pixel region 12. The first section 36 of one of the common interconnects 30, 32, and 34 (common interconnect 30, for example) may be disposed outside the first section 36 of one of the other common interconnects (common interconnect 32 or 34, for example) (at a position close to the edge of the substrate 10). One of the common interconnects 30, 32, and 34 (common interconnect 30 (second section 38 of the common interconnect 30 in more detail), for example) may be disposed at a position closer to the pixel region 12 than one of the other common interconnects (common interconnect 32 or 34 (second section 38 of the common interconnect 32 or 34 in more detail), for example).

The common interconnects 30, 32, and 34 may be electrically connected with a plurality of interconnects 44, 46, and 48 (see FIG. 2). The number of common interconnects 30, 32, and 34 (three, for example) may be less than the number of interconnects 44, 46, and 48 (3×n (n=2, 3, 4, . . . ), for example). Groups of the interconnects 44, 46, and 48 may each be electrically connected with the common interconnects 30, 32, and 34.

The side interconnect 22 (second section 26 of the side interconnect 22, for example) may be disposed at a location closer to the pixel region 12 than the common interconnects 30, 32, and 34 (second sections 38 of the common interconnects 30, 32, and 34, for example). The side interconnect 22 may be formed outside the common interconnects 30, 32, and 34, or formed to surround the common interconnects 30, 32, and 34. In more detail, the first section 24 of the side interconnect 22 may be formed outside the first sections 36 of the common interconnects 30, 32, and 34 (at a position close to the edge of the substrate 10).

Figure 3A:
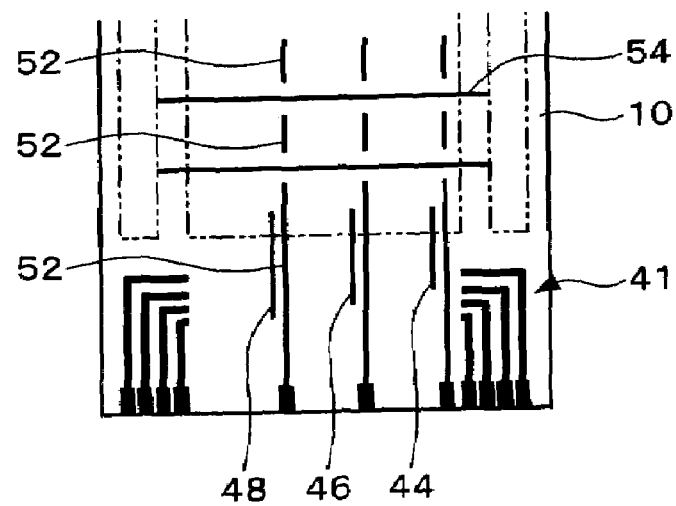
FIGS. 3A to 3C show a conductive pattern in each layer in the order from the bottom to the top.
Figure 3B:
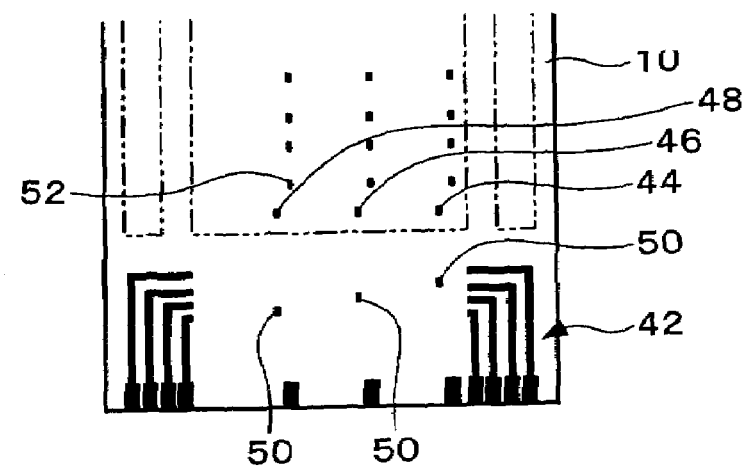
Figure 3C:
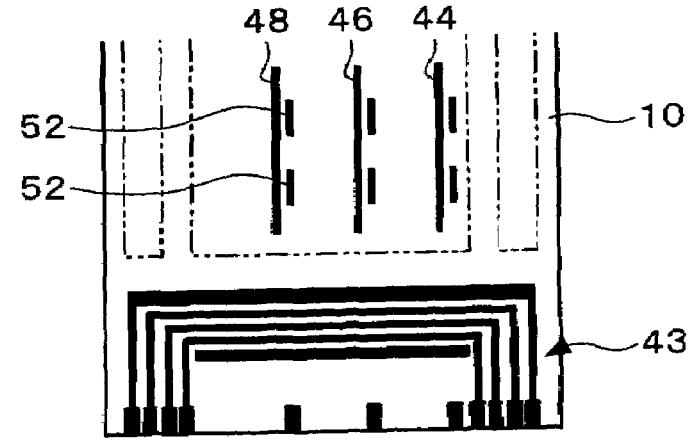
Figure 4:
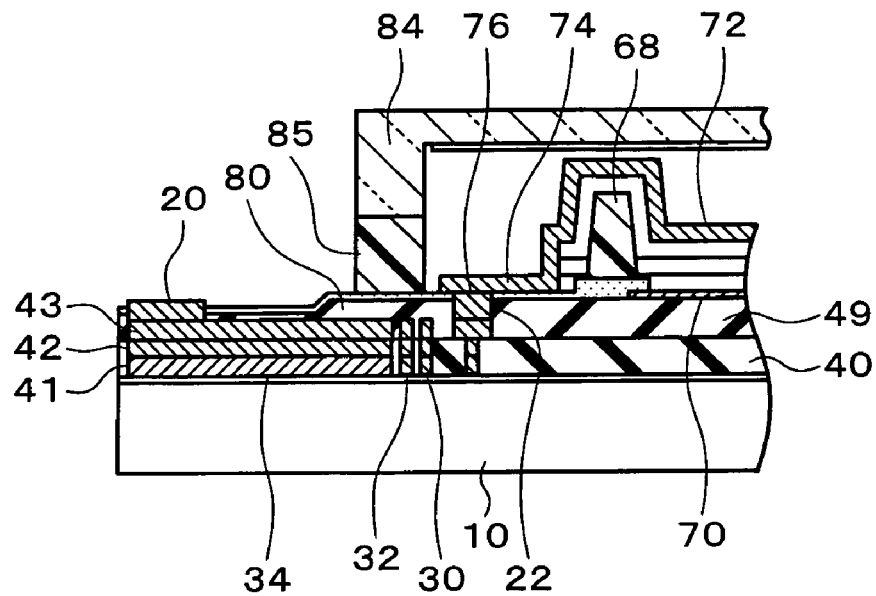
FIG. 4 is a cross-sectional view along the line IV—IV shown in FIG. 2.

The electro-optical device 1 (substrate 10, for example) has a multilayer structure including a plurality of conductive pattern layers. FIGS. 3A to 3C show a conductive pattern in each layer in the order from the bottom to the top. FIG. 4 is a cross-sectional view along the line IV—IV shown in FIG. 2.

The side interconnect 22 includes a stacked portion of at least two conductive pattern layers. As shown in FIG. 4, at least a part of the side interconnect 22 is formed by a stacked portion consisting of a part of a conductive pattern 41 (see FIG. 3A), a part of a conductive pattern 42 (see FIG. 3B) formed on the conductive pattern 41, and a part of a conductive pattern 43 (see FIG. 3C) formed on the conductive pattern 42, for example. This enables at least a part of the side interconnect 22 to be formed thickly, whereby electrical resistance can be reduced. This may be applied to at least either the external terminals 20 or the common interconnects 30, 32, and 34. The conductive pattern 41 is covered with an insulator 40 (insulating layer) excluding a part of the conductive pattern 41 (see FIG. 5). The conductive pattern 43 is covered with an insulator 49 (insulating layer) excluding a part of the conductive pattern 43 (see FIG. 4).

Figure 5:
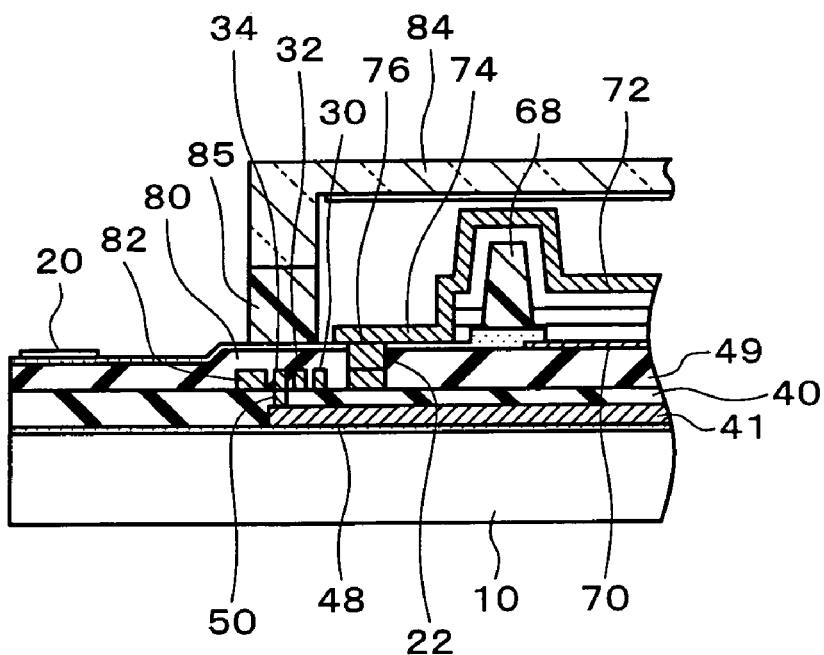
FIG. 5 is a cross-sectional view along the line V—V shown in FIG. 2.

FIG. 5 is a cross-sectional view along the line V—V shown in FIG. 2. The interconnects (anode lines, for example) 44, 46, and 48, which are electrically connected with the common interconnects 30, 32, and 34, are formed on the substrate 10. Each of the interconnects 44, 46, and 48 is electrically connected with the second sections 38 of one of the common interconnects 30, 32, and 34. In a matrix display device which includes pixels arranged in the shape of a matrix, the number of interconnects 44, 46, and 48 may be the same as the number of columns of the pixels. The interconnects 44, 46, and 48 may be formed by a part of at least two conductive pattern layers. For example, the interconnects 44, 46, and 48 may be formed by allowing a part of the conductive pattern 41 (see FIG. 3A) to be electrically connected with a part of the conductive pattern 42 (see FIG. 3B) formed on the conductive pattern 41, and allowing a part of the conductive pattern 42 (see FIG. 3B) to be electrically connected with a part of the conductive pattern 43 (see FIG. 3C) formed on the conductive pattern 42.

The common interconnects 30, 32, and 34 are respectively electrically connected with a group of the interconnects 44, 46, or 48, but are not electrically connected with the other groups. For example, the interconnects 44 (first group) may be electrically connected with the common interconnect 30, the interconnects 46 (second group) may be electrically connected with the common interconnect 32, and the interconnects 48 (third group) may be electrically connected with the common interconnect 34. In this case, the common interconnect 30 is not electrically connected with the interconnects 46 and 48 (second and third groups), the common interconnect 32 is not electrically connected with the interconnects 44 and 48 (first and third groups), and the common interconnect 34 is not electrically connected with the interconnects 44 and 46 (first and second groups).

The interconnects 44, 46, and 48 may be disposed to cross over or under the common interconnects 30, 32, and 34. In this case, a contact section is provided between the overlapping sections which need to be electrically connected, and the insulator 40 (insulating layer) is provided between the overlapping sections which need not be electrically connected. For example, first contact sections 50 which electrically connect the interconnects 44, 46, and 48 with the common interconnects 30, 32, and 34 may be formed by using a part of the conductive pattern 42 shown in FIG. 3B. In this case, the overlapping sections of the interconnects 44, 46, and 48 and the common interconnects 30, 32, and 34 may be formed by using a part of the conductive patterns 41 and 43 (see FIGS. 3A and 3C) located in layers differing from the conductive pattern 42 (upper and lower layers adjacent to the conductive pattern 42, for example). In the present embodiment, the interconnects 44, 46, and 48 are formed to pass under the common interconnects 30, 32, and 34. The first contact sections 50 between the common interconnects 30, 32, and 34 and the interconnects 44, 46, and 48 are located in the end region 18 (end region in which the external terminals 20 are formed, for example).

The interconnects 44, 46, and 48 may be disposed to cross over or under the side interconnect 22. In this case, the insulator 40 (insulating layer) is provided between the overlapping sections. For example, the overlapping sections of the interconnects 44, 46, and 48 and the side interconnect 22 may be formed by using a part of the conductive patterns 41 and 43 (see FIGS. 3A and 3C) located in layers between which either a plurality of stacked layers or a single layer is interposed. In the present embodiment, the interconnects 44, 46, and 48 are formed to pass under the side interconnect 22. This enables capacitors to be formed by the interconnects 44, 46, and 48, the insulator 40 (insulating layer), and the side interconnect 22, whereby a rapid voltage drop of the interconnects 44, 46, and 48 can be prevented.

Figure 6:
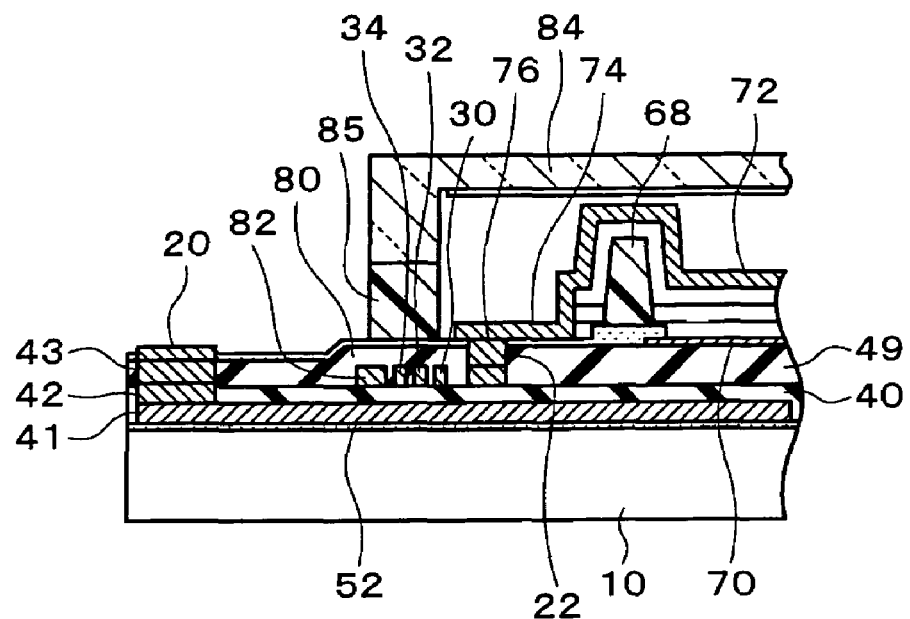
FIG. 6 is a cross-sectional view along the line VI—VI shown in FIG. 2.

FIG. 6 is a cross-sectional view along the line VI—VI shown in FIG. 2. A plurality of interconnects 52 (signal lines, for example) are, formed on the substrate 10. The interconnects 52 may be formed by using a part of at least two conductive pattern layers, For example, the interconnects 52 may be formed by allowing a part of the conductive pattern 41 (see FIG. 3A) to be electrically connected with a part of the conductive pattern 42 (see FIG. 3B) formed on the conductive pattern 41, and allowing a part of the conductive pattern 42 (see FIG. 3B) to be electrically connected with a part of the conductive pattern 43 (see FIG. 3C) formed on the conductive pattern 42.

The interconnects 52 may be disposed to cross over or under the side interconnect 22 and the common interconnects 30, 32, and 34. In this case, the insulator 40 (insulating layer) is provided between the overlapping sections. For example, the overlapping sections of the interconnects 52 and the side interconnect 22 and the overlapping sections of the interconnects 52 and the common interconnects 30, 32, and 34 may be formed by using a part of the conductive patterns 41 and 43 (see FIGS. 3A and 3C) located in layers between which either a plurality of stacked layers or a single layer is interposed. In the present embodiment, the interconnects 52 are formed to pass under the side interconnect 22 and the common interconnects 30, 32, and 34. A capacitor may not be formed between the interconnect 52 and the side interconnect 22 (or common interconnects 30, 32, and 34), or the influence of the capacitor may be reduced by forming the interconnect 52 at an interval from the side interconnect 22 (or common interconnects 30, 32, and 34). This reduces the capacitor impedance for a signal which flows through the interconnect 52.

A plurality of interconnects 54 (scanning lines, for example) are formed on the substrate 10. The interconnects 54 are electrically connected with the driver circuit 14 (scanning line driver circuit, for example). The driver circuits 14 may be electrically connected with either end of the interconnects 54. The matrix regions, may be partitioned by the interconnects 54 and the interconnects 44, 46, 48, and 52. The interconnects 54 may be disposed to cross over or under the interconnects 44, 46, 48, and 52. In this case, the insulator 40 (insulating layer) is provided between the overlapping sections. For example, the overlapping sections of the interconnects 54 and the interconnects 44, 46, 48, and 52 may be formed by using a part of the conductive patterns 41 and 43 (see FIGS. 3A and 3C) located in layers between which either a plurality of stacked layers or a single layer is interposed. In the present embodiment, the interconnects 54 are formed to pass under the interconnects 44, 46, 48, and 52.

Figure 7:
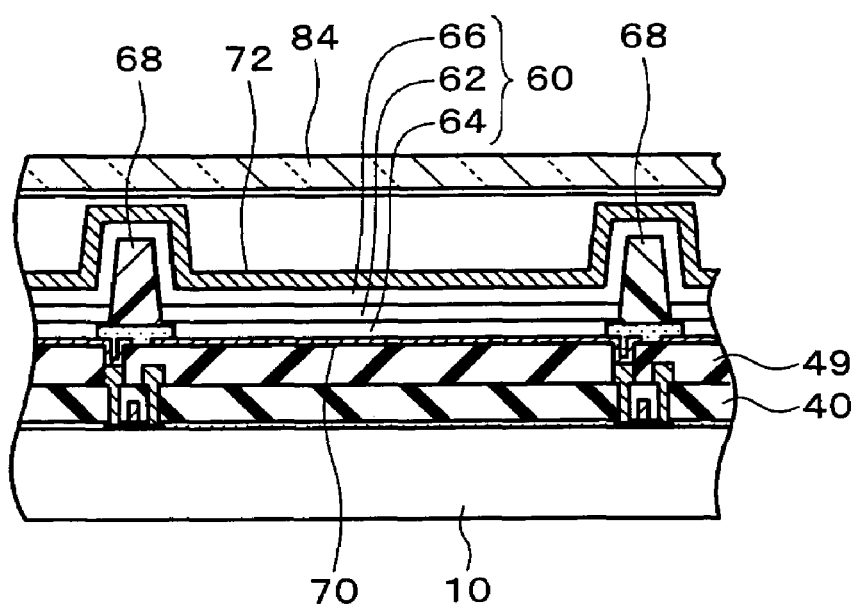
FIG. 7 is a cross-sectional view along the line VII—VII shown in FIG. 2.

FIG. 7 is a cross-sectional view along the line VII—VII shown in FIG. 2. The electro-optical elements 60 are formed on the substrate 10. The region in which the electro-optical elements 60 are formed is the pixel region 12. The electro-optical elements 60 include a plurality of light-emitting layers 62 of different emitted colors (red, green, and blue, for example). The electro-optical element 60 includes the light-emitting layer 62 of one of the emitted colors. The material for the light-emitting layer 62 may be a polymer material, a low-molecular-weight material, or a composite of these. The light-emitting layer 62 emits light when a current flows through the light-emitting layer 62. The luminous efficiency of the light-emitting layers 62 may differ corresponding to the emitted colors. A group of interconnects 44, 46, or 48 electrically connected with the common interconnect 30, 32, or 34 correspond to the light-emitting layers 62 of a single emitted color (electrically connected in more detail).

The electro-optical element 60 may include at least one of first and second buffer layers 64 and 66. The first buffer layer 64 may be a hole injection layer which stabilizes injection of holes into the light-emitting layer 62, or may include a hole injection layer. The first buffer layer 64 may include a hole transport layer. The hole transport layer may be formed between the light-emitting layer 62 and the hole injection layer. The second buffer layer 66 may be an electron injection layer which stabilizes injection of electrons into the light-emitting layer 62, or may include an electron injection layer. The second buffer layer 66 may include an electron transport layer. The electron transport layer may be formed between the light-emitting layer 62 and the electron injection layer. The adjacent electro-optical elements 60 are separated (electrically insulated) by a bank 68.

The pixel electrodes 70 are formed on the substrate 10. The pixel electrode 70 supplies electrical energy to the electro-optical element 60. The pixel electrode 70 may be in contact with the electro-optical element 60 (first buffer layer 64 (hole injection layer), for example). The pixel electrode 70 is electrically connected with one of the interconnects 44, 46, and 48. Each of the interconnects 44, 46, and 48 may be electrically connected with a group of pixel electrodes 70.

At least one common electrode 72 is formed on the substrate 10. The common electrode 72 supplies electrical energy to the electro-optical element 60. The common electrode 72 may be in contact with the electro-optical element 60 (second buffer layer 66 (electron injection layer), for example). The common electrode 72 has a section which faces the pixel electrode 70. The common electrode 72 may be disposed over the pixel electrode 70.

The common electrode 72 is electrically connected with the conductive section 74. The conductive section 74 may be formed so as not to face the pixel electrode 70. The common electrode 72 may be integrally formed with the conductive section 74. The conductive section 74 is electrically connected with the side interconnect 22 (second section 26 of the side interconnect 22, for example). A second contact section 76 between the conductive section 74 and the side interconnect 22 may be located in the end region 18 (end region in which the first contact sections 50 are formed or the end region in which the external terminals 20 are formed, for example). In the case where the conductive section 74 is in contact with the side interconnect 22, the contact section between the conductive section 74 and the side interconnect 22 is the second contact section 76. The second contact section 76 may extend in the direction of the width of the pixel region 12. For example, the second contact section 76 may be formed to have a length equal to or greater than the interval between the pixel electrodes 70 located on either end in the direction of the width of the pixel region 12. Electrical resistance between the conductive section 74 and the side interconnect 22 can be reduced by increasing the length of the second contact section 76. As a result, electrons smoothly flow from the side interconnect 22 to the common electrode 72.

A covering layer 80 is formed on the substrate 10 so as to cover the common interconnects 30, 32, and 34. The covering layer 80 may be formed of a single layer or a plurality of layers. The covering layer 80 may be formed of an electrically insulating material. At least the surface of the covering layer 80 may be formed of an oxide or a nitride. The side interconnect 22 (at least the second section 26) is exposed from the covering layer 80.

As shown in FIGS. 5 and 6, a spacer 82 is formed at a position adjacent to the common interconnects 30, 32, and 34. (at a position at a distance from the pixel region 12 or a position close to the edge of the substrate 10, for example). The spacer 82 may be a dummy interconnect formed of the same material as the material for at least one of the common interconnects 30, 32, and 34, the side interconnect 22, and the interconnects 44, 46, 48, and 52. The spacer 82 is formed under the covering layer 80. The surface of the covering layer 80 is made higher in the region adjacent to the common interconnects 30, 32, and 34 by forming the spacer 82. The difference in height of the surface of the covering layer 80 may be reduced or eliminated between the region over the common interconnects 30, 32, and 34 and the region over the spacer 82 by forming the spacer 82. The degree of inclination or unevenness of the surface of the covering layer 80 may be reduced or the surface of the covering layer 80 may be made flat from the region over the common interconnects 30, 32, and 34 to the region over the spacer 82.

A sealing member 84 for the electro-optical element 60 is formed on the substrate 10. In the case where at least a part of the electro-optical element 60 easily deteriorates due to water, oxygen, or the like, the electro-optical element 60 can be protected by the sealing member 84. The installation section of the sealing member 84 for the substrate 10 (covering section 80, for example) may be disposed so as to avoid (so as not to come in contact with) the side interconnect 22 or the conductive section 74. In this case, the installation section of the sealing member 84 may be disposed outside the side interconnect 22 and the conductive section 74 (at a position at a distance from the pixel region 12 or a position close to the edge of the substrate 10). This enables the sealing member 84 to be reliably secured to the substrate 10 (covering section 80, for example) by using an adhesive 85, even if at least the surface of the side interconnect 22 or the conductive section 74 is formed of a material having poor adhesion to the adhesive 85 (metal, for example). The covering section 80 may have higher adhesion to the adhesive 85 than that of a metal.

In the present embodiment, the common interconnects 30, 32, and 34 are formed outside the side interconnect 22 (at a position at a distance from the pixel region 12 or a position close to the edge of the substrate 10). Therefore, the installation section of the sealing member 84 can be allowed to overlap at least a part of the common interconnects 30, 32, and 34. This enables the size of the sealing member 84 to be reduced, whereby the size of the electro-optical device 1 can be reduced. The installation section of the sealing member 84 may be located over at least a part of the spacer 82 and at least a part of the common interconnects 30, 32, and 34. According to this feature, since the installation section of the sealing member 84 is disposed on the surface of the covering layer 80 in the region in which the degree of inclination or unevenness is small (flat region, for example), the installation section can be provided securely.

Figure 8:
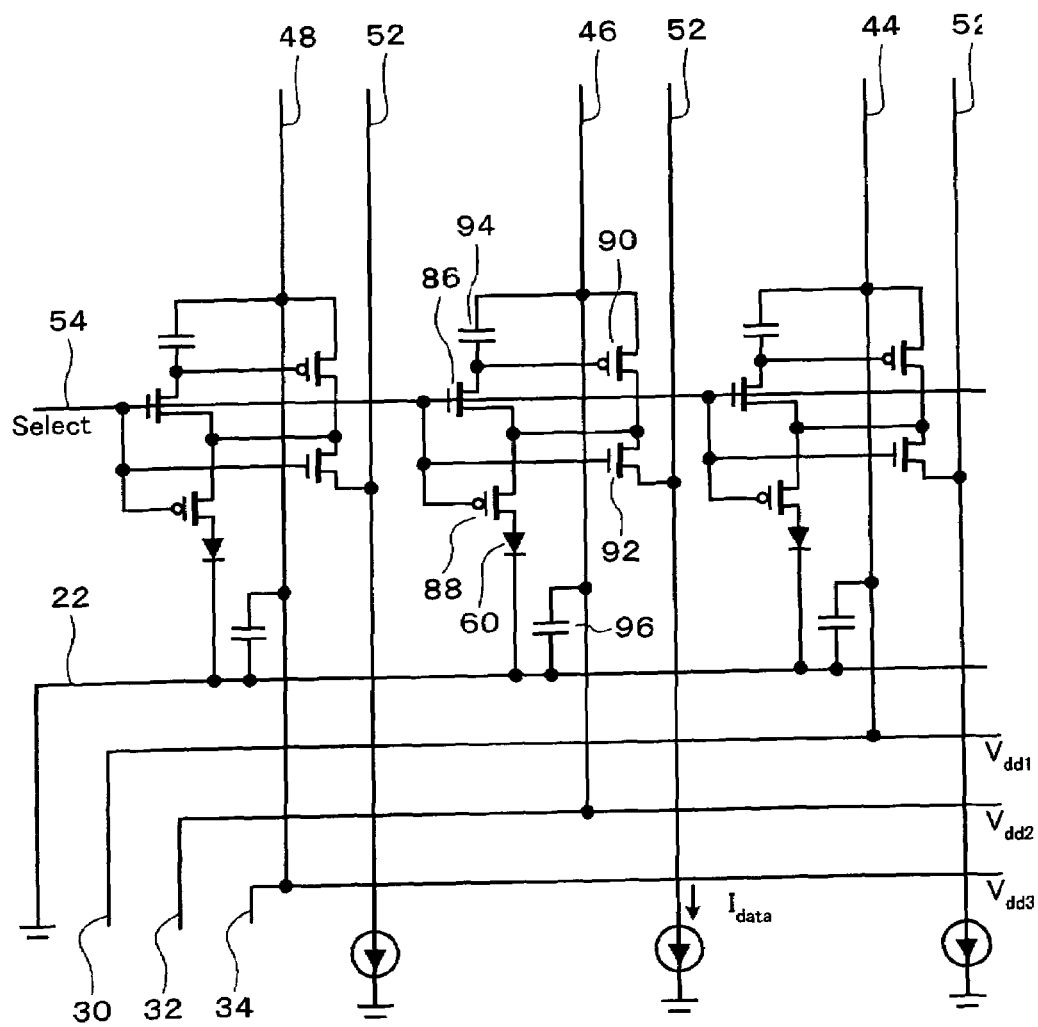
FIG. 8 is a circuit diagram showing an operation of an electro-optical device according to the first embodiment of the present invention.

FIG. 8 is a circuit diagram illustrating the operation of the electro-optical device according to the present embodiment. The electro-optical device 1 includes devices corresponding to the circuit shown in FIG. 8. Since the circuit configuration (device connection state) is as shown in FIG. 8, description of the circuit configuration is omitted. In the present embodiment, the side interconnect 22 is connected to a low potential (ground potential, for example), and the common interconnects 30, 32, and 34 are connected to potentials higher than the potential of the side interconnect 22. Different voltages $V_{dd1}$, $V_{dd2}$, and $V_{dd3}$ are respectively supplied to the common interconnects 30, 32, and 34. The voltages $V_{dd1}$, $V_{dd2}$, and $V_{dd3}$ are voltages corresponding to the luminous efficiency of the light-emitting layers 62. A current $I_{data}$ flows through the interconnect 52. The current $I_{data}$ is a signal corresponding to the current supplied to the electro-optical element 60. A select signal is input to the interconnect 54 (scanning line). The select signal is either an H signal at a high potential or an L signal at a low potential.

In the programming period, the voltage $V_{dd2}$ is supplied to the interconnect 46, and the current $I_{data}$ flows through the interconnect 52, for example. In the programming period, the H signal is input to the interconnect 54, whereby switching devices 86 and 92 are turned ON and a switching device 88 is turned OFF. When the current $I_{data}$ flows through the interconnect 52 from the interconnect 46 through the switching devices 90 and 92, a control voltage of the switching device 90 (gate voltage if the switching device 90 is a MOS transistor) becomes a value corresponding to the current $I_{data}$, and a charge corresponding to the control voltage is stored in the capacitor 92.

In an operation period (light-emitting period, for example), the L signal is input to the interconnect 54, whereby the switching devices 86 and 92 are turned OFF and the switching device 88 is turned ON. The switching device 90 is controlled (turned ON, for example) by the control voltage (gate voltage if the switching device 90 is a MOS transistor) corresponding to the charge stored in the capacitor 92 during the programming period, whereby a current corresponding to the control voltage flows through the electro-optical element 60 from the interconnect 46 by way of the switching devices 90 and 88.

The above-described devices are provided for each of the electro-optical elements 60. The switching devices 86, 88, 90, and 92 may be formed by using a polysilicon thin film or the like. In the present embodiment, capacitors 94 are formed by using the side interconnect 22 (cathode interconnect, for example), the interconnects 44, 46, and 48 electrically connected with the common interconnects 30, 32, and 34 (anode interconnects, for example), and the insulators 40 (insulating layers) provided therebetween. Therefore, a rapid voltage drop of the common interconnects 30, 32, and 34 (anode interconnects, for example) can be prevented.

In the method of manufacturing the electro-optical device according to the present embodiment, the electro-optical elements 60 are formed in the pixel region 12 of the substrate 10. The pixel electrodes 70 for supplying electrical energy to the electro-optical elements 60 are formed on the substrate 10. The common electrodes 72 for supplying electrical energy to the electro-optical elements 60 are formed on the substrate 10. The interconnects 44, 46, and 48 are formed on the substrate 10 so as to be electrically connected with the pixel electrodes 70. The conductive section 74 is formed on the substrate 10 so as to be electrically connected with the common electrode 72.

The external terminals 20 may be formed on the substrate 10. The external terminals 20 may be formed in the end region 18 separated from the pixel region 12 by the straight line L which passes outside the pixel region 12.

The common interconnects 30, 32, and 34 may be formed on the substrate 10 so as to be electrically connected with the interconnects 44, 46, and 48. The common interconnects 30, 32, and 34, which are less in number than the interconnects 44, 46, and 48, may be formed on the substrate 10. The common interconnects 30, 32, and 34 may be formed in the end region 18 of the substrate 10 (end region in which the external terminals 20 are formed or the end region in which the side interconnect 22 is formed, for example). The common interconnects 30, 32, and 34 may be formed to include the first section 36 which extends from the external terminal 20 in the direction toward the pixel region 12, and the second section 38 which is bent at the first section 36 and extends in the direction of the width of the pixel region 12 so as to be electrically connected with the interconnects 44, 46, and 48. The first contact sections 50 between the interconnects 44, 46, and 48 and the common interconnects 30, 32, and 34 may be formed in the end region 18.

The side interconnect 22 may be formed on the substrate 10 so as to be electrically connected with the conductive section 74. The side interconnect 22 may be formed in the end region 18 of the substrate 10 (end region in which the external terminals 20 are formed or the end region in which the common interconnects 30, 32, and 34 are formed). The side interconnect 22 may be formed to include the first section 24 which extends from the external terminal 20 in the direction toward the pixel region 12, and the second section 26 which is bent at the first section 24 and extends in the direction of the width of the pixel region 12 so as to be electrically connected with the conductive section 74. The second contact section 76 between the conductive section 74 and the side interconnect 22 may be disposed in the end region 18 (end region in which the first contact section 50 is positioned, for example).

According to the present embodiment, in the case where at least either the common interconnects 30, 32, and 34 or the side interconnect 22 is formed in the end region 18, the interconnect region (frame, for example) can be reduced in the other regions. In the case where at least either the first contact sections 50 between the interconnects 44, 46, and 48 and the common interconnects 30, 32, and 34 or the second contact section 76 between the conductive section 74 and the side interconnect 22 is formed in the end region 18, the interconnect region (frame, for example) can be reduced in the other regions.

Second Embodiment

Figure 9:
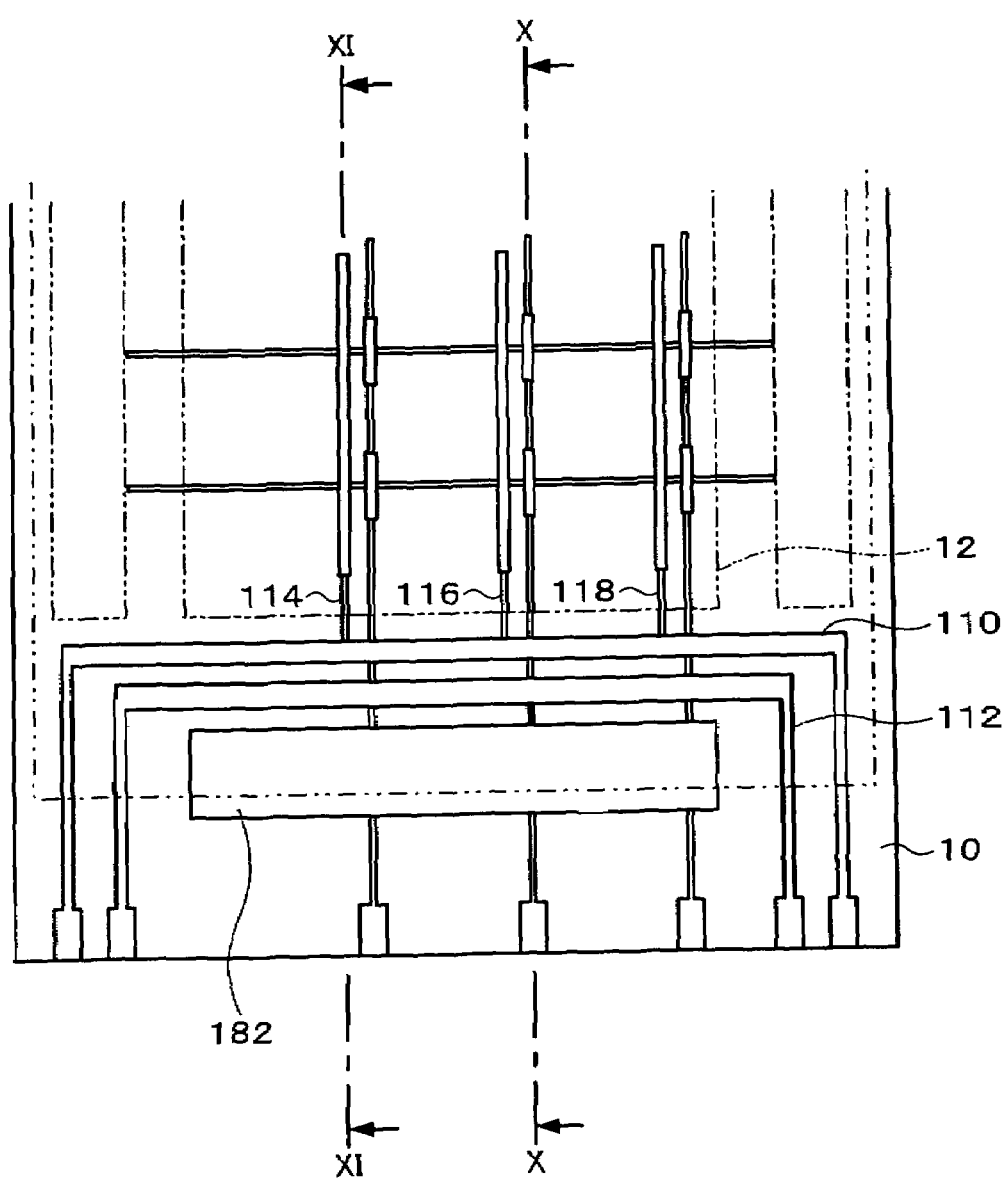
FIG. 9 shows details of an electro-optical device according to a second embodiment of the present invention.
Figure 10:
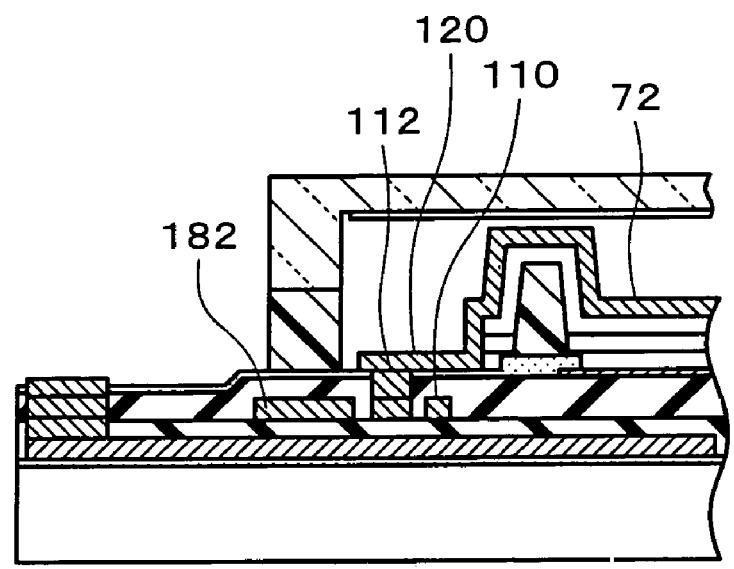
FIG. 10 is a cross-sectional view along the line X—X shown in FIG. 9.
Figure 11:
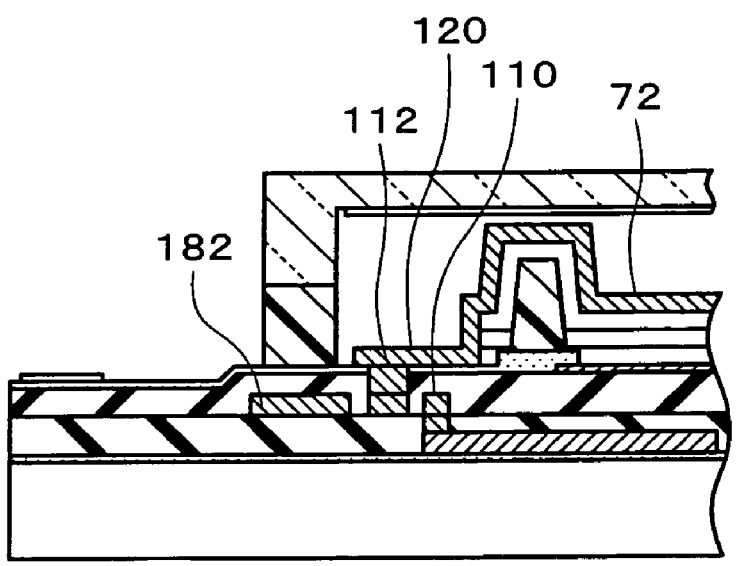
FIG. 11 is a cross-sectional view along the line XI—XI shown in FIG. 9.

FIG. 9 shows details of an electro-optical device according to a second embodiment of the present invention. FIG. 10 is a cross-sectional view along the line X—X shown in FIG. 9. FIG. 11 is a cross-sectional view along the line XI—XI shown in FIG. 9. In the present embodiment, one common interconnect 110 is formed on the substrate 10. The common interconnect 110 is disposed at a position closer to the pixel region 12 than a side interconnect 112. A spacer 182 is disposed at a position farther from the pixel region 12 than the side interconnect 112. A plurality of interconnects 114, 116, and 118 are formed on the substrate 10. The interconnects 114, 116, and 118 are electrically connected with one common interconnect 110. The interconnects 114, 116, and 118 are formed to pass under a conductive section 120 which is electrically connected with the common electrode 72 through an insulator. Capacitors 122 (see FIG. 12) may be formed by the interconnects 114, 116, and 118, the insulator, and the conductive section 120. This prevents a rapid voltage drop of the interconnects 114, 116, and 118.

Figure 12:
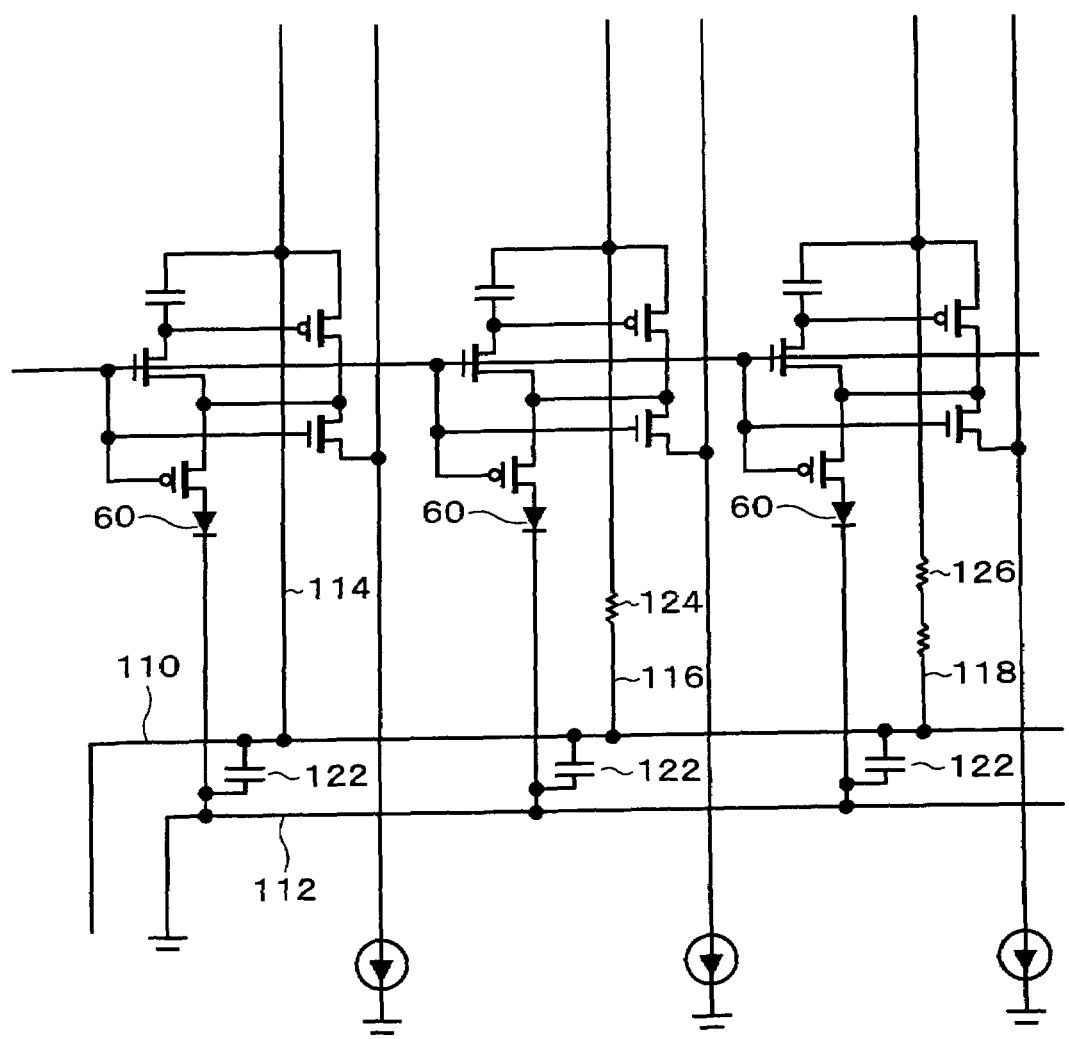
FIG. 12 is a circuit diagram of an electro-optical device according to the second embodiment of the present invention.

FIG. 12 is a circuit diagram of the electro-optical device according to the present embodiment. The interconnects 114, 116, and 118 are divided into a plurality of groups corresponding to the structure or function (luminous efficiency, for example) of the electro-optical element 60. Resistors 124 and 126 may be electrically connected with one or a plurality of groups of interconnects 116 and 118. For example, the resistor 124 may be electrically connected with the interconnect 116, and the resistor 126 having a resistance differing from the resistance of the resistor 124 may be electrically connected with the interconnect 118. A resistor need not be electrically connected with one group of interconnects 114. In the case where the interconnect 114 has a resistance, the resistance of the resistors 124 and 126 is set to be different, from the resistance of the interconnect 114. This enables different voltages to be applied to, the electro-optical elements 60 corresponding to the luminous efficiency. As a result, brightness of the electro-optical elements 60 can be made uniform, even if the emitted colors differ. The description of the first embodiment may be applied to the electro-optical device according to the present embodiment. The description of the first embodiment may be applied to the method of manufacturing the electro-optical device according to the present embodiment.

Figure 13:
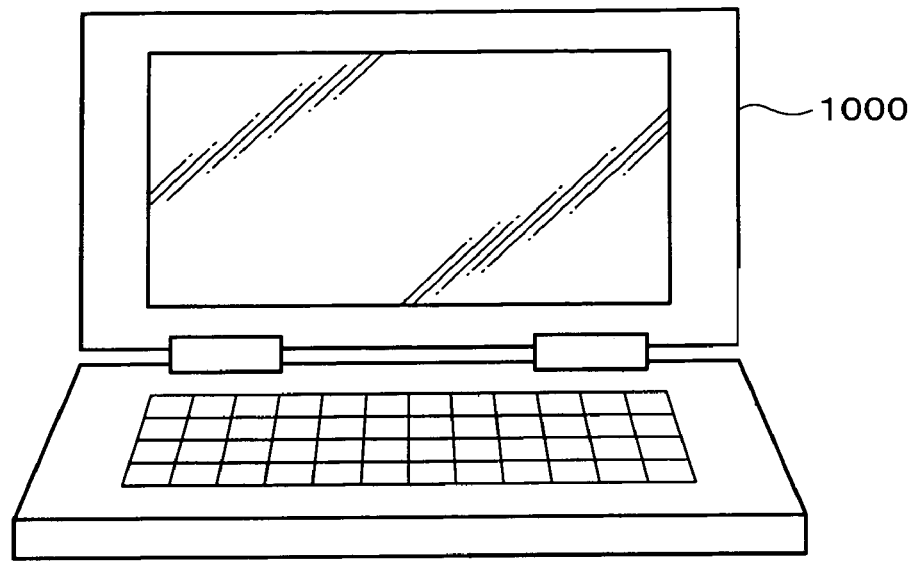
FIG. 13 shows an electronic instrument according to an embodiment of the present invention.
Figure 14:
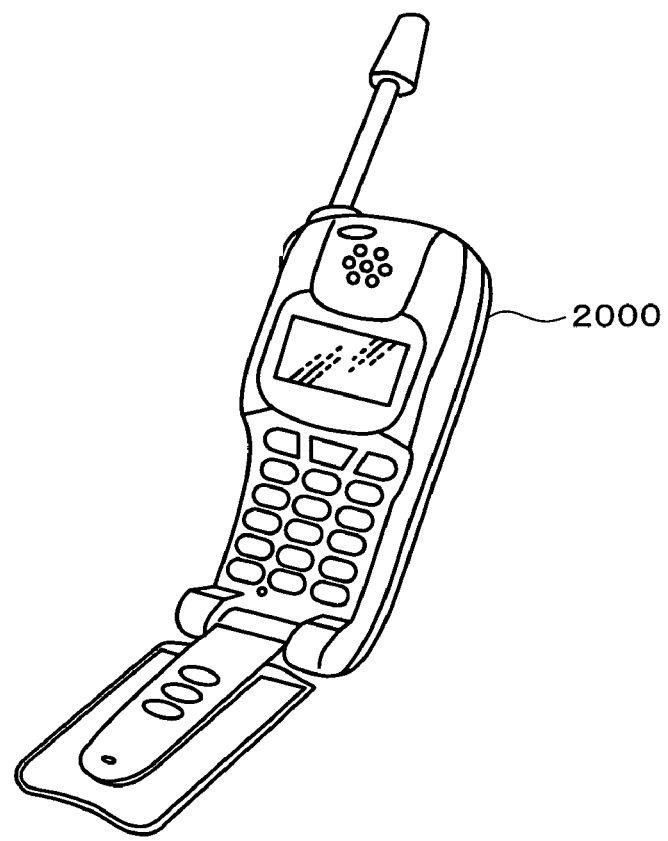
FIG. 14 shows another electronic instrument according to an embodiment of the present invention.

FIGS. 13 and 14 respectively show a notebook-type personal computer 1000 and a portable telephone 2000 as examples of electronic instruments including the electro-optical device according to the embodiment of the present invention.

The present invention is not limited to the above-described embodiments. Various modifications and variations are possible. For example, the present invention includes configurations essentially the same as the configurations described in the embodiments (for example, configurations having the same function, method, and results, or configurations having the same object and results). The present invention includes configurations in which any unessential part of the configuration described in the embodiments is replaced. The present invention includes configurations having the same effects or achieving the same object as the configurations described in the embodiments. The present invention includes configurations in which conventional technology is added to the configurations described in the embodiments.

What is claimed is:

1. An electro-optical device having a substrate, a plurality of pixel electrodes provided in a pixel region of the substrate, a plurality of electro-optical elements, each of the electro-optical elements being provided for one of the pixel electrodes, and a common electrode provided in common for the electro-optical elements, each of the electro-optical elements being driven by a voltage applied to corresponding one of the pixel electrodes and a voltage applied to the common electrode, the electro-optical device comprising:

a plurality of interconnects electrically connected with the pixel electrodes;

a conductive section electrically connected with the common electrode;

a plurality of external terminals provided in an end region separated from a region in which the pixel region is provided by a straight line passing outside the pixel region; and a side interconnect which is formed in the end region in which the external terminals are provided and includes a first section and a second section, the first section extending from one of the external terminals in a direction toward the pixel region, and the second section being bent at the first section and extends in a width direction of the pixel region and electrically connected with the conductive section.

2. An electronic instrument having the electro-optical device as define in claim 1.

3. An electro-optical device having a substrate, a plurality of pixel electrodes provided in a pixel region of the substrate, a plurality of electro-optical elements, each of the electro-optical elements being provided for one of the pixel electrodes, and a common electrode provided in common for the electro-optical elements, each of the electro-optical elements being driven by a voltage applied to corresponding one of the pixel electrodes and a voltage applied to the common electrode, the electro-optical device comprising:

a plurality of interconnects electrically connected with the pixel electrodes;

a conductive section electrically connected with the common electrode;

a plurality of external terminals; and a side interconnect which includes a first section and a second section, the first section extending from one of the external terminals in a direction toward the pixel region, and the second section being bent at the first section and extends in a width direction of the pixel region and electrically connected with the conductive section, wherein a contact section between the conductive section and the side interconnect is provided in an end region separated from a region in which the pixel region is provided by a straight line passing outside the pixel region.

4. An electronic instrument having the electro-optical device as define in claim 3.

5. A method of manufacturing an electro-optical device, comprising:

forming a plurality of electro-optical elements in a pixel region of a substrate;

forming a plurality of pixel electrodes on the substrate for supplying electrical energy to the electro-optical elements;

forming a common, electrode on the substrate for supplying electrical energy to the electro-optical elements;

forming a plurality of interconnects on the substrate so as to be electrically connected with the pixel electrodes;

forming a conductive section on the substrate so as to be electrically connected with the common electrode;

forming a plurality of external terminals in an end region of the substrate separated from a region in which the pixel region is provided by a straight line passing outside the pixel region; and forming a side interconnect in the end region of the substrate in which the external terminals are provided and includes a first section and a second section, the first section extending from one of the external terminals in a direction toward the pixel region, and the second section being bent at the first section and extends in a width direction of the pixel region and electrically connected with the conductive section.

6. A method of manufacturing an electro-optical device, comprising:

forming a plurality of electro-optical elements in a pixel region of a substrate;

forming a plurality of pixel electrodes on the substrate for supplying electrical energy to the electro-optical elements;

forming a common electrode on the substrate for supplying electrical energy to the electro-optical elements;

forming a plurality of interconnects on the substrate so as to be electrically connected with the pixel electrodes;

forming a conductive section on the substrate so as to be electrically connected with the common electrode;

forming a plurality of external terminals on the substrate; and forming on the substrate a side interconnect which includes a first section and a second section, the first section extending from one of the external terminals in a direction toward the pixel region, and the second section being bent at the first section and extends in a width direction of the pixel region and electrically connected with the conductive section, wherein a contact section between the conductive section and the side interconnect is provided in an end region separated from a region in which the pixel region is provided by a straight line passing outside the pixel region.

* * * * *